(12) United States Patent
Chambers (10) Patent No.: US 6,898,680 B2
(45) Date of Patent: May 24, 2005

(54) MINIMIZATION OF OVERHEAD OF NON-VOLATILE MEMORY OPERATION

(75) Inventor: Peter Chambers, Phoenix, AZ (US)

(73) Assignee: Micrel, Incorporated, San Jose, CA (US)

( * ) Notice: Subject to any disclaimer, the term of this patent is extended or adjusted under 35 U.S.C. 154(b) by 156 days.

(21) Appl. No.: 10/336,296

(22) Filed: Jan. 3, 2003

(65) Prior Publication Data

US 2004/0133755 A1 Jul. 8, 2004

(51) Int. Cl.[7] ............................................. G06F 12/12
(52) U.S. Cl. ....................... 711/159; 711/103; 711/155; 711/156
(58) Field of Search ................................ 711/103, 155, 711/156, 159

(56) References Cited

U.S. PATENT DOCUMENTS

| | | | |
|---|---|---|---|
| 5,594,883 A | 1/1997 | Pricer | |
| 5,675,537 A | 10/1997 | Bill et al. | |
| 5,802,343 A | * 9/1998 | Fandrich et al. | ............ 711/158 |
| 6,032,248 A | 2/2000 | Curry et al. | |
| 6,272,047 B1 | 8/2001 | Mihnea et al. | |
| 6,400,603 B1 | 6/2002 | Blyth et al. | |
| 6,643,758 B2 | * 11/2003 | Furuyama et al. | .......... 711/203 |
| 6,654,848 B1 | * 11/2003 | Cleveland et al. | .......... 711/103 |
| 2001/0021958 A1 | 9/2001 | Zink et al. | |
| 2002/0144066 A1 | * 10/2002 | Talreja et al. | ............... 711/154 |

FOREIGN PATENT DOCUMENTS

| | | |
|---|---|---|
| EP | 1209568 | 5/2002 |
| GB | 2283342 | 5/1995 |

OTHER PUBLICATIONS

Agilent Technologies, "Evaluation of Flash Memory Cells," Application Note 4156–4, printed Oct. 2000, pp. 1–4.
Altera Corporation, "Using Altera Enhanced Configuration Devices," Apr. 2002, ver. 1.0, Application Note 218, pp. 1–19.
AMD, "Understanding Burst Mode Flash Memory Devices," Application Note, Publication #23710, Rev: A, Issue Date: Mar. 23, 2000, pp. 1–4.
"Hardware Description," Sbus 32–Mbyte NVRAM Card Installation and User's Guide, Sep. 1997, pp. 1–2.
Loughmiller, Dan, "Semiconductor Memories," Micron Technology, Inc., Boise, ID, Oct. 2001, 7 pages.
Xilinx, "Xilinx Generic Flash Memory Interface Solutions," White Paper: Spartan–II, WP143 (v1.0), May 8, 2001, pp. 1–12.

* cited by examiner

*Primary Examiner*—Matthew D. Anderson
(74) *Attorney, Agent, or Firm*—Bever, Hoffman & Harms, LLP

(57) ABSTRACT

A method and structure are provided that reduce the overall time of the read-erase-modify-write cycle time of non-volatile memories. Specifically, the erase operation of the read-erase-write cycle is avoided in certain circumstances. In one embodiment, the erase operation is skipped where a predetermined pattern is found in at least a portion the block. In another embodiment, the erase operation is skipped where a status of the block indicates that the erase operation can be skipped.

30 Claims, 5 Drawing Sheets

MINIMIZATION OF OVERHEAD OF NON-VOLATILE MEMORY OPERATION

BACKGROUND OF THE INVENTION

1. Technical Field

The disclosure relates to non-volatile integrated circuit memory devices and, amongst other things, to reducing the time required for erasing and writing to a non-volatile memory that is erased in blocks.

2. Discussion of the Related Art

A type of non-volatile integrated circuit memory, known as flash memory, retains its data content even when the power to the flash memory is turned off. Flash memories are typically subdivided into blocks (e.g., pages of four bytes) that include a plurality of memory cells arranged in bytes of individual bits. The size of blocks varies depending on the memory and manufacturer. For instance, the blocks can vary in size from hundreds of bytes to megabytes.

A basic flash memory operation is to update data stored in particular bytes of particular blocks of the flash memory, without necessarily changing the data stored elsewhere in the same block. It is not generally possible to overwrite existing data with new data when updating flash memory. Rather, an update operation must: (1) read the entire block and store the data of at least those portions of the block that are not to be updated; (2) erase the entire block (called a "block erase" herein); (3) merge the new data with the stored data that was not to be updated, if any; and (4) write the merged data to the appropriate portions of the block, thereby inserting new data into the updated portion of the block and restoring the data of those portions that were not to be updated. During the block erase, all of the cells of the block are set to a fixed data pattern, e.g., all ones.

The above described update operation is time-consuming, in large part because the block erase step takes a significant amount of time. The block erase operation may take, for instance, on the order of 10 ms. In contrast, a write operation may take only a fraction of this time, e.g., 60 microseconds. The block erase operation is performed regardless of whether the portion of the block to be updated already is in an erased state before the update operation begins.

There is a great desire among flash memory users to increase the speed of memory operations. The present invention improves the state of the art by, among other things, greatly reducing the time necessary to update data in a flash memory.

SUMMARY OF THE DISCLOSURE

A method and structure are provided that reduce the overall time of the read-erase-modify-write cycle time of non-volatile memories. Specifically, erase operations can be avoided in certain circumstances.

In one embodiment, a method of operating a non-volatile memory comprises reading at least a portion of a block, determining whether a predetermined pattern exists in at least the portion, and writing new data or erasing the block prior to writing new data, depending on whether the predetermined pattern exists.

In another embodiment, a method of operating a non-volatile memory comprises determining a state of at least a portion of a block, and performing an erase operation on the block or writing to at least the portion of the block based upon the state.

In a further embodiment, a non-volatile memory comprises a memory array comprising a plurality of non volatile memory elements and a controller coupled with the memory array. The controller determines a state of at least a portion of a block and instructs performance of an erase operation and a write operation or only a write operation based upon the state.

In an additional embodiment, a system including a non-volatile memory comprises a memory array comprising a plurality of non-volatile memory elements and a processing system coupled with the memory array. The processing system comprises a processor that determines a state of at least a portion of a block and instructs performance of an erase operation and a write operation or only a write operation based upon the state.

DETAILED DESCRIPTION

Figure 1:
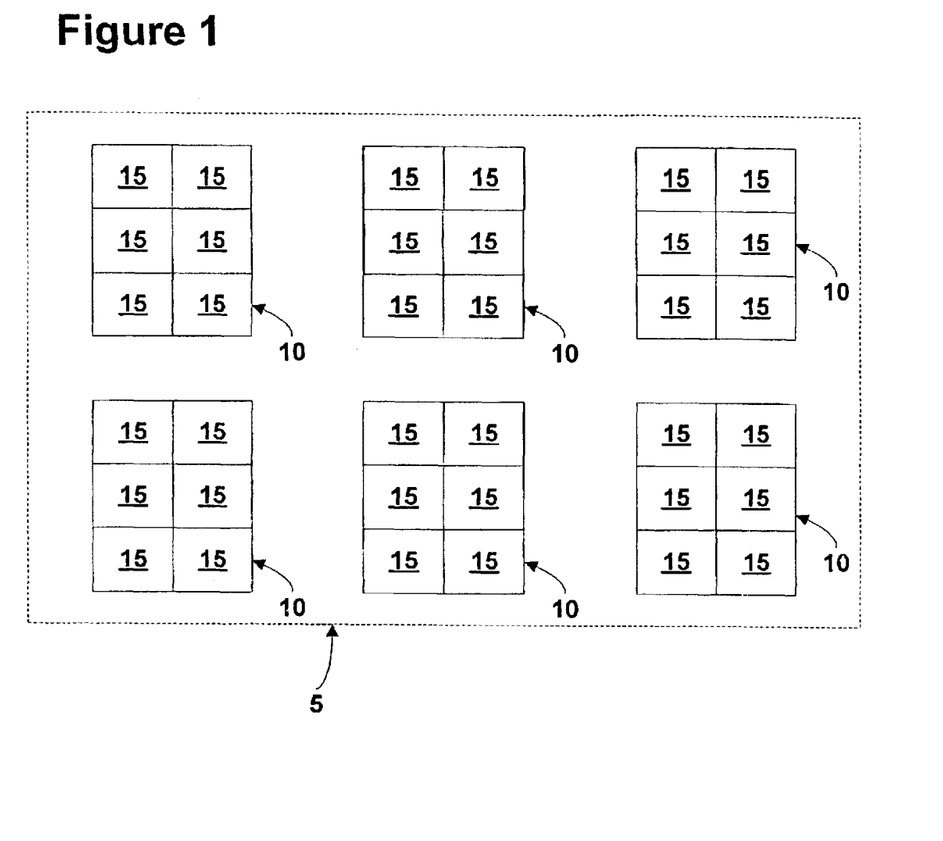
FIG. 1 illustrates a block diagram of an embodiment of a non-volatile memory array.

Referring to FIG. 1, a block diagram of an exemplary embodiment of a non-volatile memory array is illustrated. Non-volatile memory array 5 includes a plurality of non-volatile memory elements 10. Each of the non-volatile memory elements 10 divided into a plurality of blocks 15. Each of the plurality of blocks 15 may be further subdivided, for instance, into bytes of individual non-volatile memory cells (not shown), each of which stores a zero or a one. In one embodiment, block 15 may be a page of a specified number of bytes (e.g., four bytes). In this example, in order to update a portion of a block 15 (e.g., bit, byte, or word) located in one of the non-volatile memory elements 10, an erase operation for the entire block 15 where the bit, byte, or word is located may be performed.

In order to reduce the time required to update the data of one or more blocks 15, embodiments of the present invention allow the omission of the time-consuming block erase cycle in certain instances, thereby saving time in an update operation.

Figure 2:
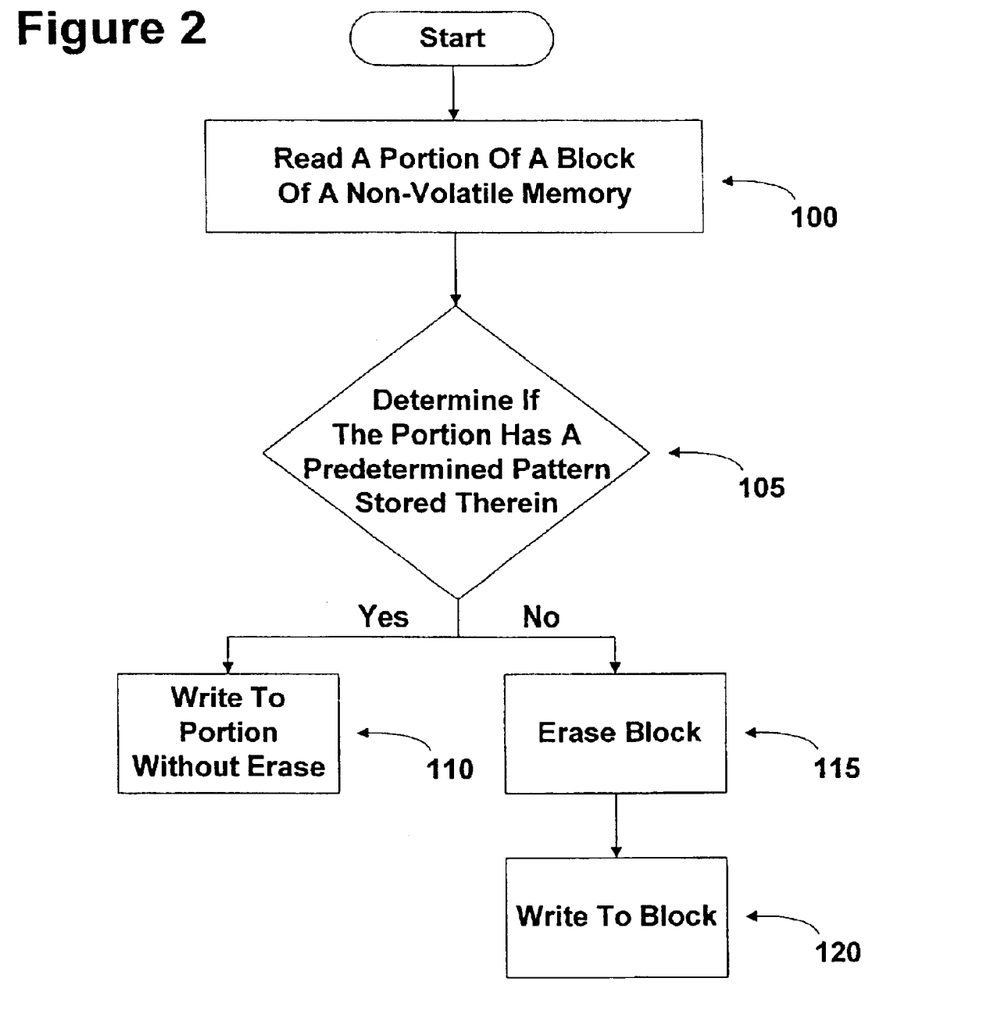
FIG. 2 illustrates a flow chart of an embodiment of a method for reducing the time required to perform write and erase operation for a non-volatile memory that is erased in blocks.

Referring to FIG. 2, a flow chart of an embodiment of a method for reducing the time required to update a non-volatile memory that is erased in blocks is illustrated. In step 100 of FIG. 2, at least a portion (e.g., a byte) of block 15 that is to be updated is read and stored in a buffer or the like in the read step.

The read operation of step 100 may be done using a standard read operation, a burst mode read operation, synchronous read operation, asynchronous read operation, or the like.

In step 105, after or during the read operation of step 100, a determination is made as to whether the portion of block 15 to be updated has a predetermined pattern stored therein. In this example, the predetermined pattern is indicative of whether the portion of block 15 is currently in an erased state due, for instance, to a previous erasure of block 15 or an initialization of the non-volatile memory array 5. The predetermined pattern can, for example, be all high states, i.e., binary one levels, for a conventional non-volatile memory. Alternatively, the predetermined pattern may comprise all low states, i.e., binary zero levels, if the erase cycle of the non-volatile memory utilizes low states as the erased state.

Returning to FIG. 2, if the portion of the block 15 to be updated is found to have the predetermined pattern, then a write operation (step 10) can proceed, without having to perform a block erase to erase the entire the block 15. During step 1 10, new data is written to the portion of block 15 to be updated.

On the other hand, if during step 105 the portion of the block 15 to be updated is found not have the predetermined pattern, then, in step 115, any data of block 15 that is not be updated is read and stored, and a block erase operation is performed. After step 115 is complete, a write operation (step 120) is performed. During step 120, new data is written to the portion of block 15 to be updated, and any saved data is rewritten to those portions of the block 15 that are not to be updated.

By performing the determination of step 105, it may be possible, based on whether the predetermined pattern is present, to omit the block erase step in comparison to the conventional process. Omission of the time consuming block erase operation greatly reduces the overall time of a memory update operation, thereby speeding memory operations and increasing the number of functions for which the nonvolatile memory can be used, among other benefits. Alternatively, the read step 100 can be performed so that the entirety or multiple portions, i.e. multiple words, bytes or bits, of the block 15 are read. In one embodiment, all of the words, bytes or bits that are to be not to be updated are read in read step 100. The determination step 105 is then made as to whether the predetermined pattern is found in the portions of the block that are read during read step 105.

Figure 3:
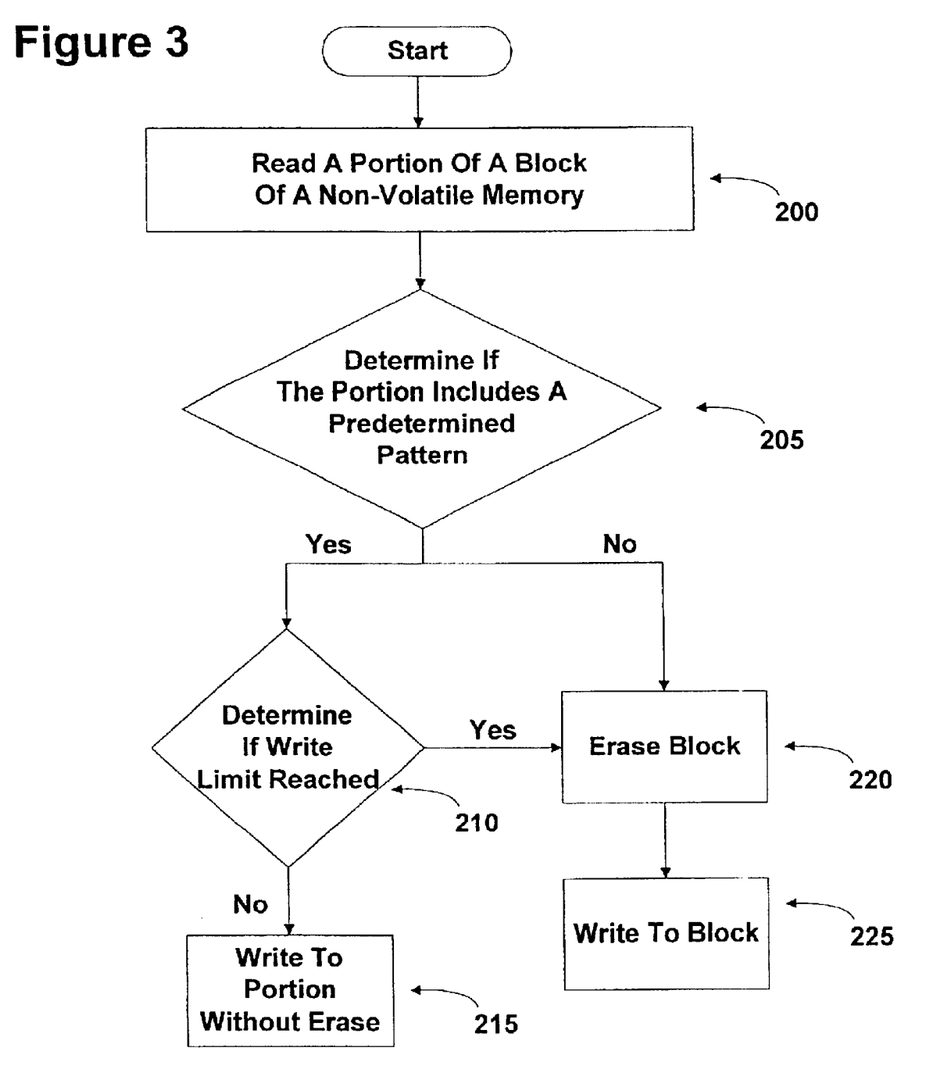
FIG. 3 illustrates a flow chart of another embodiment of a method for reducing the time required to perform write and erase operation for a non-volatile memory that is erased in blocks.

Referring to FIG. 3, a flow chart of another embodiment of a method for reducing the time required to perform write and erase operation for a non-volatile memory that is erased in blocks is illustrated. The method of FIG. 3 may be used with memories that have a write limit. A write limit is an enforced limit of the number of write operations that can be performed in a block without a block erase operation. Much of the method of FIG. 3 is similar to the above-described method of FIG. 2, hence our discussion can be abbreviated.

Initially in the method of FIG. 3, a read step 200 and determination step 205 are performed. These steps are similar to steps 100 and 105 of FIG. 2, and hence are not described further. Subsequently, if through performance of step 205 of FIG. 3 it is determined that the predetermined pattern is not present in the portion of block 15 to be updated, then block erase step 220 and write step 225 are performed, similar to steps 115 and 120 of FIG. 2. In write step 225, the new data and any saved data are merged and written to the updated and non-updated portions, respectively, of block 15.

Returning to FIG. 3, if the predetermined pattern is found in the portion of block 15 to be updated as a result of steps 200 and 205, then a further determination is made (step 210) as to whether a write limit has been reached for the block 15. The write limit would be implemented, for instance, through use of a counter that would count the number of write operations to the block 15, and comparison of the count value to a stored write limit can be made.

If through the performance of step 210 of FIG. 3 it is determined that the write limit has not been reached, then a block erase operation is not necessary, and is omitted. Subsequently, in step 215, a write operation is performed that updates the portion of block 15 to be updated, similar to step 110 of FIG. 2. In addition, the write limit counter is updated. Again, omission of the erase operation greatly increases the efficiency of the update operation.

On the other hand, if through the performance of step 200 of FIG. 3 it is determined that the write limit has been reached, then a block erase operation (step 220) is performed, notwithstanding that the portion of block 15 to be updated has the predetermined pattern (e.g., all ones indicative of an erased state). After the block erase of step 220, write step 225 is performed, similar to write step 120 of FIG. 2. In addition, the write limit counter is reset.

In an alternative embodiment, the method of FIG. 3 may be rearranged so that the step of checking whether the write limit is exceeded (step 200) for the block 15 may be performed before step 100 or before step 105. If the write limit has been exceeded, then contents of the block 15 that are not to be updated are read and saved, a block erase is performed, the new and saved data are merged and written to the block 15, and the write limit counter is reset.

Figure 4:
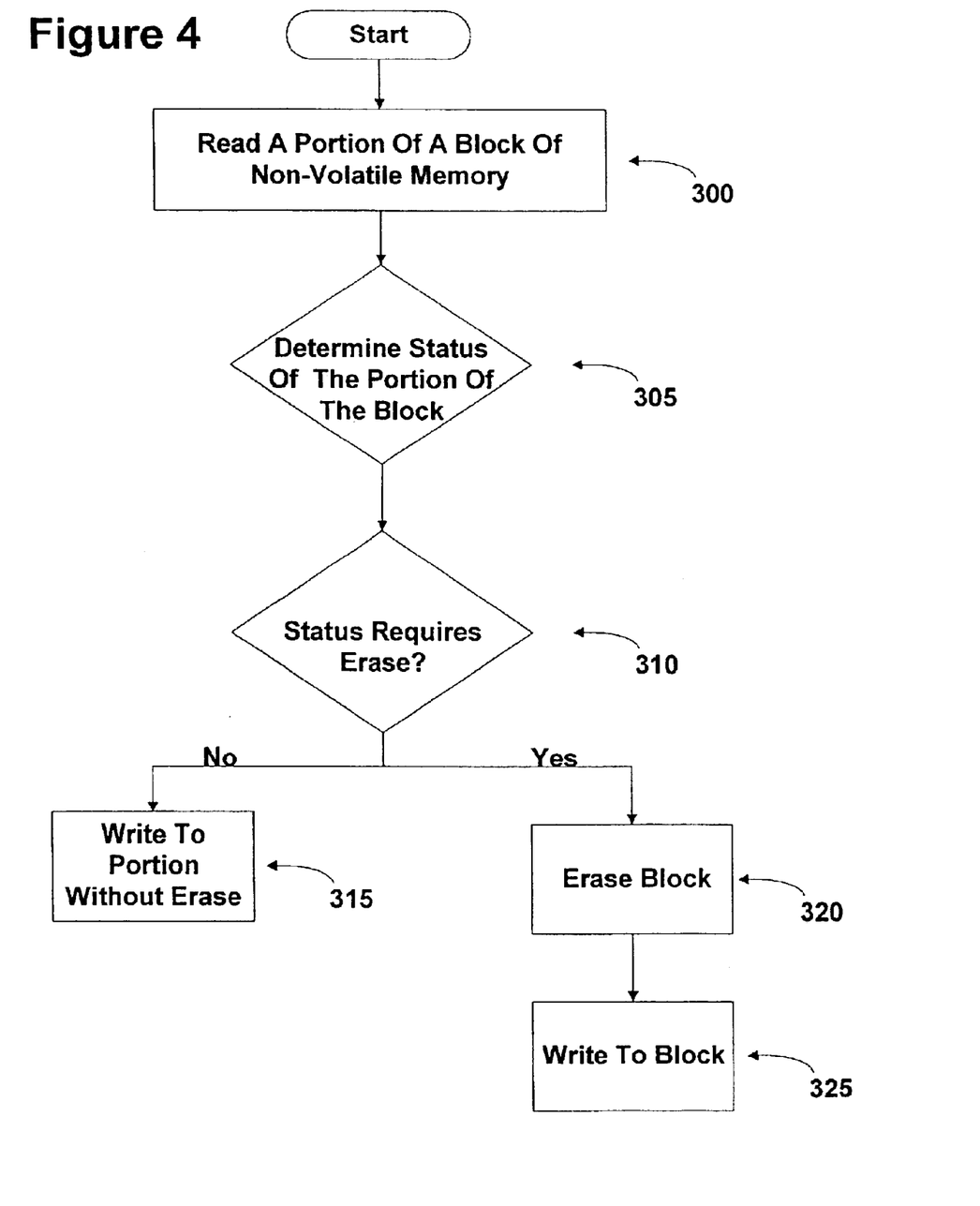
FIG. 4 illustrates a flow chart of a further embodiment of a method for reducing the time required to perform write and erase operation for a non-volatile memory that is erased in blocks.

Referring to FIG. 4, a flow chart of a further embodiment of a method for reducing the time required to update a non-volatile memory that is erased in blocks 15 (FIG. 1) is illustrated. The method of FIG. 4 assumes that, during operation of the memory, a status is saved and regularly updated that gives a status of the block or each particular portion of the block that is to be periodically updated. The status relates to whether or not the block 15 or a particular portion thereof has been written to previously or is currently in an erased state. The status can be stored as an identifier related to the block 15 in an auxiliary register or other memory. Alternatively, the identifier may be stored in block 15 itself.

In FIG. 4, a read operation (step 300) is performed on a block 15 of a non-volatile memory. In step 305, a status identifier of the block 15, or of the portion of block 15 to be updated, also is read. In step 310, a determination is then made as to whether the status indicator indicates that the block 15 or the particular portion thereof needs to be erased prior to a write operation. If the outcome of step 310 is that the block 15 or portion thereof is erased or not previously written, then a write operation (step 315) may be performed without a block erase, as described above for step 110 of FIG. 2, thereby saving significant time in the memory operation. If the outcome of step 310 is that the block 15 or portion thereof is not erased or has previously been written to, then a block erase (step 320) and a write operation (step 325) are performed, as described above for steps 115 and 120 of FIG. 2.

It should be noted that, where the status indicator is stored in a location that may be accessed without reading the block 15, then step 300 may be performed before, simultaneous with, or after step 305, and in some instances may be omitted depending on the results of step 305.

The methods described with respect to FIGS. 2–4 can simultaneously determine whether multiple portions in one or more blocks 15 are in an erased state. To do this, read steps 100 and 200 would read portions or entireties of multiple blocks 15 and determination steps 105, 205, and 310 would then determine whether each of the portions or blocks is in an erased state.

Figure 5:
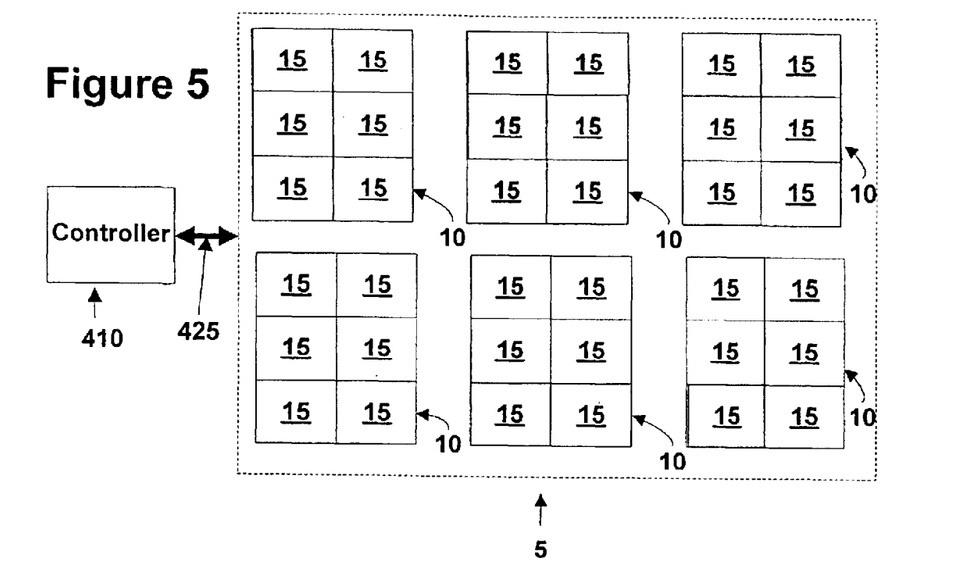
FIG. 5 illustrates a block diagram of an embodiment of a non-volatile memory.

Referring to FIG. 5, a block diagram of an embodiment of a non-volatile memory is illustrated. Non-volatile memory 400 includes memory array 5 and a controller 410. As described above, exemplary memory array 5 includes a number of non-volatile memory elements 10, which are made up of blocks 15 that are made up of cells (not shown). Memory array 5 and controller 410 may be in the same integrated circuit or on different integrated circuits.

Controller 410 communicates with memory array 5 over a bus 420. The controller 410 controls the memory operations of each of non-volatile memory elements 10, including read, erase, modify, and write operations set forth in FIGS. 2–4. Controller 410 can make a determination to skip a block erase operation prior to performing a write operation to a block 15. The determination as to whether to skip an erase operation can be made using any of the methods or variations thereof as described with respect to FIGS. 2–4. For instance, with respect to FIGS. 2 and 3, steps 105, 205, and 210 may be performed by controller 410. In so doing, controller 410 may compare the read data to a stored copy of the predetermined pattern. With respect to FIG. 4, controller can read the status of the portion or block from a memory (step 305), such as a register.

Controller 410 interfaces with an external computer system, data processing system, device controller, or other system controller for an external system of which the non-volatile memory 400 is part, e.g., where the memory array 5 is part of a computer. Controller 410 receives data and code files from the external system, e.g., the microprocessor of a computer. Controller 410 then performs the necessary programming operation to store the data and code files into memory array 5.

When the external system wants to read, write or erase data to one or more blocks of the one or more of the non-volatile memory elements 10, the external system sends a command to controller 410, which then accesses the specific blocks 15 of non-volatile memory element 10 to perform the desired function.

The architecture described with respect to FIG. 5 can be referred to as an internal interface non-volatile memory system. Examples of internal interface non-volatile memory systems include NOR (memory cells connected to the bit lines in a parallel wired-NOR configuration), NAND (memory cells connected to the bit lines in a series NAND configuration), and AND (a hybrid of the two) systems, among other possibilities.

Figure 6:
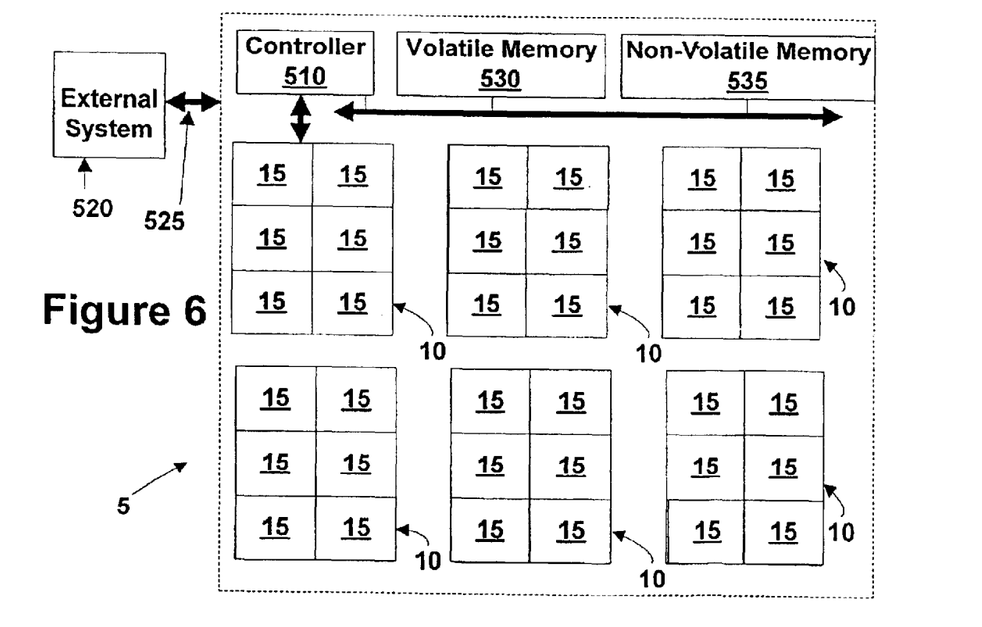
FIG. 6 illustrates a block diagram of another embodiment of a system including a non-volatile memory.

Referring to FIG. 6, a block diagram of a system including a non-volatile memory is illustrated. Non-volatile memory 500 includes memory array 5 that is coupled to controller 510 via bus 515. The memory array 5 is includes a number of non-volatile memory elements 10, which are made up of a plurality of blocks 15, as described above.

Controller 510 is also connected to external data processing system 520 via bus 525. Controller 510 receives data, addresses, and control information from data processing system 520. The control information can include instructions or commands for non-volatile memory array 500 to perform the required memory operations. Controller 510 in turn controls access to memory array 5 in accordance with the data, address, and control information received.

As previously described, the memory operations of memory array 5 include read, write, modify, and erasure operations. Controller 510 reads, erases, modifies, and writes data to and from the blocks 15 and manages the data stored in non-volatile memory array 5.

Volatile memory buffer 530 of controller 510 may be used to buffer data to and from memory array 5. Volatile memory buffer 530 can also be used to store status information regarding each block of memory of the non-volatile memory array 5 or be used to store the predetermined pattern(s).

The architecture described with respect to FIG. 6 can be referred to as an external interface non-volatile memory system. The external interface defines how the memory is connected into the system. A random, direct, memory-mapped interface typically requires that the flash memory have separate address, data, and control lines. This is the standard memory interface found on static random access memory (SRAM) maybe suitable for a direct connection to a microprocessor bus.

It should be noted that controller 510 can be removed, and one or more processors, general purpose or dedicated, that are part of data processing system 520 can control operation of the non-volatile memory 500 and perform as described with respect to the controller 510.

Controller 410 or 510 can be any kind of known flash memory controller and can be implemented by firmware. Alternatively, controller 410 or 510 can be implemented by other known fixed circuitry, microprocessor, or embedded processor architecture. Additionally, controller 410 or 510 can be a microprocessor that operates in conjunction with a volatile memory buffer 530 and a nonvolatile memory 535. Alternatively, controllers 410 or 510 may include more or fewer elements than those mentioned above.

Instructions required to perform the functions described with respect to FIGS. 2–4 can be implemented as computer readable instructions stored as part of the firmware or in a volatile or non-volatile memory associated with controller 410 or 510.

It should be noted that the reduction of the number of erase cycles as described in the embodiments herein, also increases the overall life of conventional flash memories, since there is a fixed number of write-erase cycles that can be performed by conventional flash memories prior to failure.

The number of blocks located on each non-volatile memory element is variable and depends on the designer of the flash memory system. The methods and systems disclosed herein may be implemented using blocks and non-volatile memory elements of any size.

The detailed description provided above is merely illustrative, and is not intended to be limiting. While the embodiments, applications and advantages of the present inventions have been depicted and described, there are many more embodiments, applications and advantages possible without deviating from the spirit of the inventive concepts described and depicted herein. The invention should only be restricted in accordance with the spirit of the claims appended hereto and is not restricted by the embodiments, specification or drawings.

What is claimed is:

1. A method of operating a non-volatile memory, comprising:

reading at least a portion of a block of a non-volatile memory;

determining whether a predetermined pattern exists in at least the portion of the block; and writing new data to at least the portion of the block, or erasing the block prior to writing new data to the block, depending on whether the predetermined pattern exists in at least the portion of the block, wherein reading at least the portion of the block comprises reading the entire block and determining whether the predetermined pattern exists in at least the portion of the block comprises determining whether the predetermined pattern exists in the entire block.

2. The method of claim 1, wherein the predetermined pattern comprises a sequence of all one binary states.

3. The method of claim 1, wherein determining whether a predetermined pattern exists in the block comprises determining whether the predetermined pattern exists after reading at least the portion of the block.

4. The method of claim 1, wherein the predetermined pattern indicates that the portion of the block is in an erased state.

5. The method of claim 1, wherein reading at least a portion of the block comprises reading at least a portion of a plurality of blocks, wherein determining whether the predetermined pattern exists comprises determining whether the predetermined pattern exists in at least the portion of each of the plurality of blocks, and wherein writing new data to the block comprises writing new data to the plurality of blocks, or erasing each of the plurality of blocks, based upon whether the predetermined pattern exists in at least the portion of each of the plurality of blocks.

6. The method of claim 1, wherein reading the block comprises reading at least the portion the block utilizing a burst mode operation.

7. The method of claim 1, wherein reading at least the portion of the block comprises reading at least the portion of the block through one of an internal interface or an external interface, wherein writing new information comprises writing the new information through one of the internal interface or the external interface, and wherein erasing the block comprises erasing the block through one of the internal interface or the external interface.

8. The method of claim 1, wherein determining whether the predetermined pattern exists comprises comparing at least the portion of the block to one or more predetermined patterns; and determining if there is a match with the one or more predetermined patterns.

9. A method of operating a non-volatile memory, comprising:

reading at least a portion of a block of a non-volatile memory;

determining whether a predetermined pattern exists in at least the portion of the block; and writing new data to at least the portion of the block, or erasing the block prior to writing new data to the block, depending on whether the predetermined pattern exists in at least the portion of the block, wherein reading at least the portion of the block comprises reading those portions of the block that are not be updated and determining whether the predetermined pattern exists in at least the portion of the block-comprises determining whether the predetermined pattern exists in those portions of the block that are not be updated.

10. A method of operating a non-volatile memory, comprising:

reading at least a portion of a block of a non-volatile memory;

determining whether a predetermined pattern exists in at least the portion of the block; and writing new data to at least the portion of the block, or erasing the block prior to writing new data to the block, depending on whether the predetermined pattern exists in at least the portion of the block, wherein determining whether a predetermined pattern exists in the block comprises determining whether the predetermined pattern exists during the reading of at least the portion of the block.

11. A method of operating a non-volatile memory, comprising:

determining a state of at least a portion of a block;

performing an erase operation on the block or writing to at least the portion of the block based upon the state; and reading at least a portion of the block, wherein determining the state comprises determining whether a predetermined pattern exists in at least the portion of the block, wherein determining the state comprises determining if the predetermined pattern exists in at least a portion of the block during reading at least the portion of the block.

12. The method of claim 11, wherein determining the state comprises retrieving a state identifier corresponding to the portion of the block and wherein the state identifier is indicative of whether the portion of the block is in an erased state.

13. The method of claim 11, wherein determining the state comprises retrieving a state identifier corresponding to the entire block and wherein the state identifier is indicative of whether the entire block is in an erased state.

14. The method of claim 11, wherein determining the state comprises determining if the predetermined pattern exists in at least the portion of the block after reading at least the portion of the block.

15. The method of claim 11, further comprising writing new information to the block, if the state of the block indicates that the block is an erased state and erasing the block prior to writing new information to the block, if the state of the block indicates that the block is not in an erased state.

16. The method of claim 11, wherein performing an erase operation on the block comprises erasing the block through one of an internal interface or an external interface.

17. The method of claim 11, wherein determining the state of the at least the portion comprises determining the state of the at least the portion of a plurality of blocks and performing the erase operation on the block or writing to at least the portion comprises erasing each block or writing to the portion of each block based upon the state of at least the portion of each block.

18. A method of operating a non-volatile memory, comprising:

determining a state of at least a portion of a block;

performing an erase operation on the block or writing to at least the portion of the block based upon the state; and reading at least a portion of the block, wherein determining the state comprises determining whether a predetermined pattern exists in at least the portion of the block, and wherein reading at least the portion of the block comprises reading the entirety of the block and wherein determining the state comprises determining whether the predetermined pattern exists in an entirety of the block.

19. A method of operating a non-volatile memory, comprising:
   determining a state of at least a portion of a block;
   performing an erase operation on the block or writing to at least the portion of the block based upon the state; and
   reading at least a portion of the block,
   wherein determining the state comprises determining whether a predetermined pattern exists in at least the portion of the block, and
   wherein reading at least the portion of the block comprises reading those portions of the block that are not be updated and wherein determining the state comprises determining whether the predetermined pattern exists in those portions of the block that are not be written.

20. A non-volatile memory, comprising:
   a memory array comprising a plurality of non volatile memory elements, each of which are erased in blocks; and
   a controller coupled with the memory array, the controller determining a state of at least a portion of a block of the plurality of blocks and instructing performance of an erase operation and a write operation or only a write operation based upon the state of the portion of the block,
   wherein the controller reads the entirety of the block and determines the state by determining if a predetermined pattern is found in the entirety of the block.

21. The non-volatile memory of claim 20, further comprising a memory containing information corresponding to the state of the portion of the block and wherein the controller determines whether to instruct performance of an erase operation and a write operation or only a write operation based upon the information corresponding to the state of the portion of the block.

22. The non-volatile memory of claim 20, further comprising a memory containing information corresponding to the state of the entirety of the block and wherein the controller determines whether to instruct performance of an erase operation and a write operation or only a write operation based upon the information corresponding to the state of the entirety of the block.

23. The non-volatile memory of claim 20, wherein the controller reads at least the portion of the block and determines the state by determining if a predetermined pattern is found in at least the portion of the block.

24. The non-volatile memory of claim 20, further comprising a bus that allows communication between the non-volatile memory and a processor.

25. A non-volatile memory, comprising:
   a memory array comprising a plurality of non volatile memory elements, each of which are erased in blocks; and
   a controller coupled with the memory array, the controller determining a state of at least a portion of a block of the plurality of blocks and instructing performance of an erase operation and a write operation or only a write operation based upon the state of the portion of the block,
   wherein the controller those portions of the block that are not be written and determines the state by determining if a predetermined pattern is found in those portions of the block that are not be written.

26. A system including a non-volatile memory, comprising:
   a memory array comprising a plurality of non volatile memory elements, each of which are erased in blocks; and
   a processing system coupled with the memory array, the processing system comprising a processor that determines a state of at least a portion of a block of the plurality of blocks and instructing performance of an erase operation and a write operation or only a write operation based upon the state of the portion of the block,
   wherein the processor reads the entirety of the block and determines the state by determining if a predetermined pattern is found in the entirety of the block.

27. The non-volatile memory of claim 26, further comprising a memory containing information corresponding a state of at least the portion of the block and wherein the processor determines whether to instruct performance of an erase operation and a write operation or only a write operation based upon information corresponding to the state of at least the portion of the block.

28. The non-volatile memory of claim 26, wherein the processor reads at least the portion of the block and determines the state by determining if a predetermined pattern is found in at least the portion of the block.

29. The non-volatile memory of claim 26, further comprising a computer motherboard and a system bus coupling the non-volatile memory and the processor.

30. The non-volatile memory of claim 26, further comprising a controller coupled to the non-volatile memory, wherein the controller provides information to the processor with respect to the state of the portion of the block.

* * * * *

UNITED STATES PATENT AND TRADEMARK OFFICE
CERTIFICATE OF CORRECTION

PATENT NO. : 6,898,680 B2
DATED : May 24, 2005
INVENTOR(S) : Peter Chambers

It is certified that error appears in the above-identified patent and that said Letters Patent is hereby corrected as shown below:

Title page,
Item [57], ABSTRACT,
Line 6, insert -- of -- after "portion".

Column 7,
Line 24, insert -- of -- after "portion".
Lines 52 and 56, replace "not be" with -- not to be --.
Line 54, replace "block-" with -- block --.

Column 9,
Lines 13 and 16, replace "not be" with -- not to be --.
Line 18, replace "non volatile" with -- non-volatile --.

Column 10,
Lines 2 and 18, replace "non volatile" with -- non-volatile --.
Lines 13 and 15, replace "not be" with -- not to be --.
Line 33, insert -- to -- after "corresponding".

Signed and Sealed this

Twelfth Day of July, 2005

JON W. DUDAS
*Director of the United States Patent and Trademark Office*